United States Patent [19]

Einbinder et al.

[11] Patent Number: 5,216,378

[45] Date of Patent: Jun. 1, 1993

[54] SWITCH ADAPTABLE RADIO FREQUENCY AMPLIFIER

[75] Inventors: Stephen B. Einbinder, Plantation; Eric K. Schroeter, Ft. Lauderdale; Leng H. Ooi, Sunrise, all of Fla.

[73] Assignee: Motorola, Inc., Schaumburg, Ill.

[21] Appl. No.: 844,016

[22] Filed: Mar. 2, 1992

[51] Int. Cl.$^5$ .......................... H03G 3/00; H04B 1/40
[52] U.S. Cl. ........................... 330/51; 330/285; 330/148; 455/86
[58] Field of Search ................. 330/51, 127, 148, 284, 330/285; 455/84, 86

[56] References Cited

U.S. PATENT DOCUMENTS 3,469,192 9/1969 Tomono .................... 330/127 X
5,060,294 10/1991 Schwent et al. ............... 330/51 X

FOREIGN PATENT DOCUMENTS 2930606 1/1981 Fed. Rep. of Germany ........ 455/84
10658 1/1977 Japan .................................. 330/254
191911 10/1984 Japan .................................. 330/254

Primary Examiner—James B. Mullins
Attorney, Agent, or Firm—M. Mansour Ghomeshi

[57] ABSTRACT

A radio frequency variable gain amplifier (204) has a plurality of outputs. The amplifier (204) includes a transistor amplifier (330) having a plurality of switchable fixed gain states for amplifying an oscillator signal. The amplifier (204) includes a biasing circuit (302, 306, 312, and 316) for selectively biasing the transistor amplifier (330) to produce the plurality of switchable fixed gain states. The biasing circuit (302, 306, 312, and 316) includes switches (310 and 320) for switching between the switchable fixed gain states of the transistor amplifier (330).

8 Claims, 3 Drawing Sheets

SWITCH ADAPTABLE RADIO FREQUENCY AMPLIFIER

TECHNICAL FIELD

This invention is generally related to communication devices and more specifically to buffers and amplifiers used in such devices.

BACKGROUND OF THE INVENTION

In the design of radio communication devices it is often necessary to provide a buffered radio frequency (RF) signal, derived from a synthesizer or an oscillator, to a mixer and a power amplifier, in the receive mode and transmit mode, respectively. Typically, the oscillator signal drives either the mixer or the power amplifier individually depending on the operating mode of the communication device. As it is well known in the art, the oscillator signal requirements for the mixer and the power amplifier are different. A typical communication device may require 0 dbm of oscillator signal for the mixer while requiring 6 dbm for the power amplifier. A number of schemes are available to provide sufficient oscillator signal to the mixer and the power amplifier. One such scheme is shown in FIG. 1. An oscillator 102 is coupled to two amplifier buffers 104 and 106. The first amplifier buffer 104 is used to amplify the oscillator signal before it is applied to a first input of a mixer 108. The mixer 108 is used to mix the received radio frequency (RF) with the oscillator signal in order to produce an intermediate frequency (IF) signal. The buffered oscillator signal at the output of amplifier 106 is coupled to a power amplifier 110. The gain of the amplifier 104 and 106 are adjusted to provide the appropriate signal levels required by the mixer 108 and the power amplifier 110. A problem with this scheme is that two amplifiers are used to provide amplification of the same signal. Secondly, both amplifiers run concurrently for the entire time the communication device is operating, thereby increasing the current consumption. A switch may be employed to switch one of the amplifiers off during desired periods. However, that switch requires operating current which adds to the current consumption of the communication device and further increases the parts count. With the high operating current requirements, it is seen that the use of two amplifiers and additional switching circuits is not recommendable in low current consuming devices such as portable communication devices. Other available methods are equally inefficient with high parts count. It is, therefore, desired to have an amplifier circuit that can be used in communication devices and provide sufficient signal level to the mixer and amplifier circuits without increasing the current drain otherwise.

SUMMARY OF THE INVENTION

A radio frequency variable gain amplifier having a plurality of outputs is provided. The amplifier includes amplifier means having a plurality of switchable fixed gain states for amplifying a signal. The amplifier also includes biasing means for selectively biasing the amplifier means to produce the plurality of switchable fixed gain states. The biasing means includes switching means for switching between the switchable fixed gain states of the amplifier.

DETAILED DESCRIPTION OF THE PREFERRED EMBODIMENT

As it is known in the art, current consumption is a significant design consideration in communication devices where power is of premium importance. Portable communication devices are typically designed with minimum current consumption to prolong their battery operating life between charges. Common to communication devices are oscillators which provide local oscillation for the recovery of a received signal in one mode and the generation of a transmit signal in another. In general, an oscillator circuit is used to provide a mixer signal and a power amplifier signal in the receive and transmit modes, respectively. More often, the coupling of the oscillator to the mixer and the power amplifier is done via a buffer amplifier circuit that includes excessive components and draws significant amounts of current because of additional switching that is required to couple the oscillator signal to either the mixer or the amplifier. The principles of the present invention provide for a buffer circuit that eliminates the need for additional switching circuits and provides the ability to provide different means for the oscillator signal as it is applied to the mixer or the power amplifier.

Figure 1:
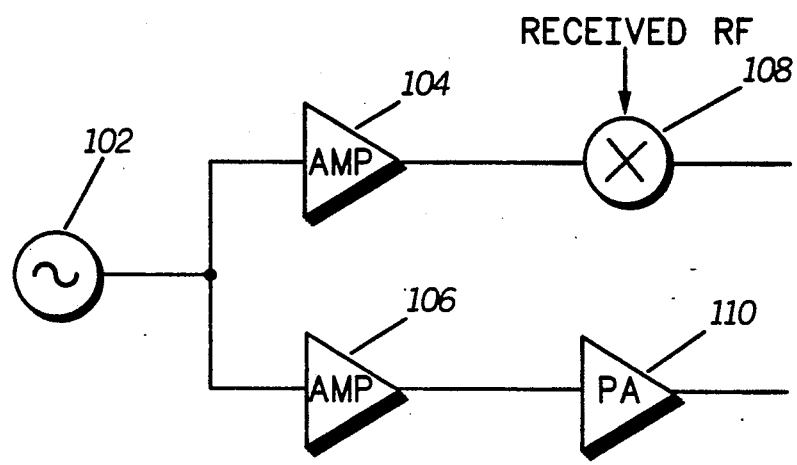
FIG. 1 shows a block diagram of a presently available oscillator circuit.
Figure 2:
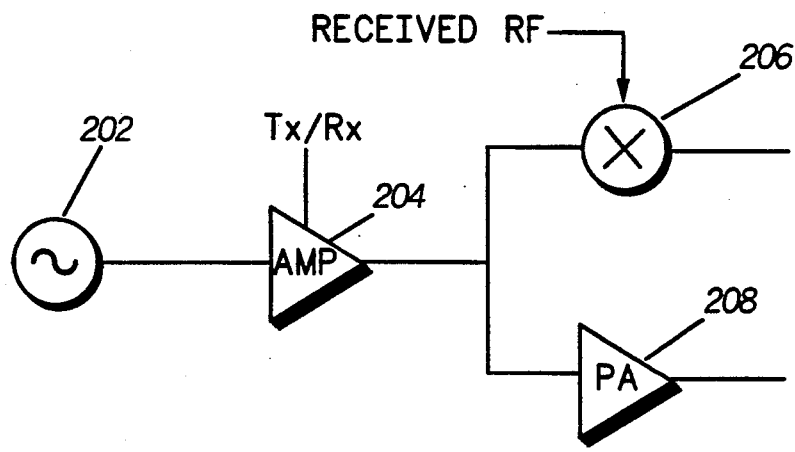
FIG. 2 shows a block diagram of the oscillator circuits in accordance with the present invention.

Referring now to the drawings and in particular to FIG. 2, a block diagram of an oscillator circuit in accordance with the present invention is shown. An oscillator 202 is coupled to a buffer amplifier 204. The output of the amplifier is routed to a mixer 206 and a power amplifier 208. The oscillator 202 comprises any well known oscillator circuits including but not limited to synthesizer and crystal control oscillators. The oscillator 202 produces a radio frequency signal which is subsequently amplified by the amplifier 204 to different levels depending on whether the signal is to be coupled to the mixer 206 or the power amplifier 208. Two control lines on the amplifier 204, Rx, and Tx, provide the switching of the gain of the amplifier 204. In the receive mode, the mixer 206 mixes a local oscillator signal with a received radio frequency signal to produce a difference signal. In the transmit mode, on the other hand, a local oscillator signal is modulated with an information signal before it is applied to a power amplifier. In general, a power amplifier requires a signal with higher amplitude than a mixer. It is due to this fact that the amplifier 204 must have the ability to adjust its gain according to the path of the oscillator signal.

Figure 3:
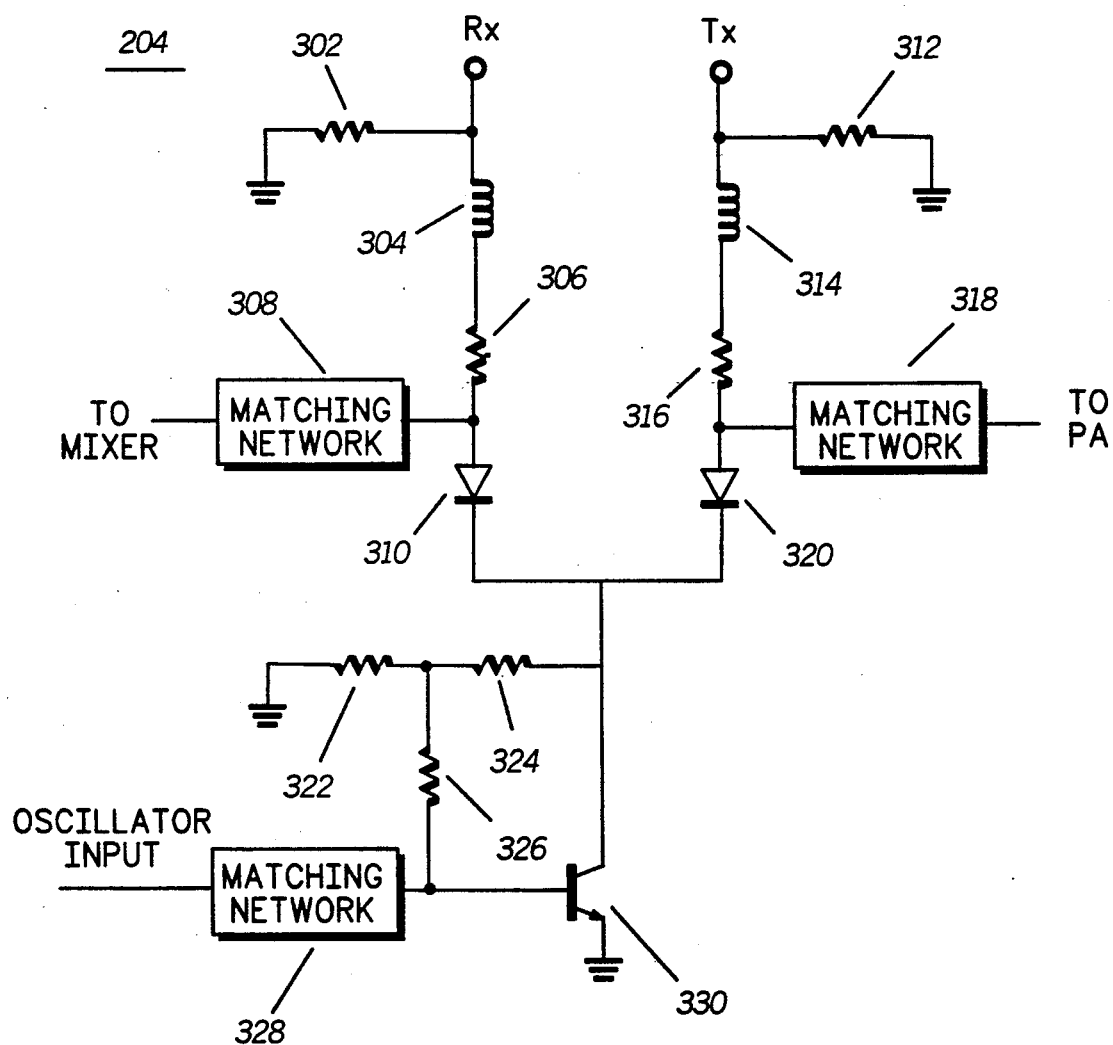
FIG. 3 shows a schematic diagram of the elements of a buffer in accordance with the present invention.

Referring to FIG. 3, a schematic diagram of the buffer amplifier 204 in accordance with the present invention is shown. The buffer amplifier 204 includes a transistor 330. An oscillator input signal is coupled to the base of the transistor 330 via matching network 328. The biasing network for the buffer 204 includes three sections, a common section, a receive section, and a transmit section. The common section includes three resistors 322, 324, and 326. The receive section includes two resistors 302, 306 an inductor 304 and a pin diode 310. Similarly, the transmit section includes two resistors, 312 and 316, an inductor 314, and a PIN diode 320. The cathode of the two pin diodes 310 and 320 are coupled to the collector of the transistor 330 to provide the collector current in order to bias a transistor. The gain of the transistor 330, as determined by the biasing can be varied depending on which one of the two pin diodes 310 and 320 is ON. Two control lines Rx and Tx, control the state of the biasing circuits by activating PIN diodes 310 and 320 when receive and transmit signals are required, respectively. The anode of the diode 310 is coupled to the mixer 206 via a matching network 308. Similarly, the anode of the diode 320 is coupled to the PA 208 via a matching network 318. In this embodiment, the high voltage applied to the receive port Rx provides a voltage across and a current through the diode 310 turning it ON, and effectively coupling the transistor 330 to the matching network 308. The selection of values of the biasing components 302, 304 and 306 in conjunction with the general biasing circuit render a desired mixer gain to the buffer 204. Similarly, when the buffer 204 is desired to be in the transmit mode, a high voltage is applied to the transmit port Tx activating the diode 320 and coupling the matching network 318 to the transistor 330. Once again, the biasing components provide the desired gain in the transmit path. It can be seen that by changing the biasing components, and hence the bias current through the transistor 330, a single amplifier is turned into a variable gain amplifier with switchable ports. By varying biasing components and their values, the gain of the amplifier 330 can be varied depending on the system requirements. In the preferred embodiment, the gain of the receiver segment is calculated to provide a mixer signal around 0 dbm while the transmit gain is adjusted to provide a 6 dbm signal to the power amplifier 208.

Figure 4:
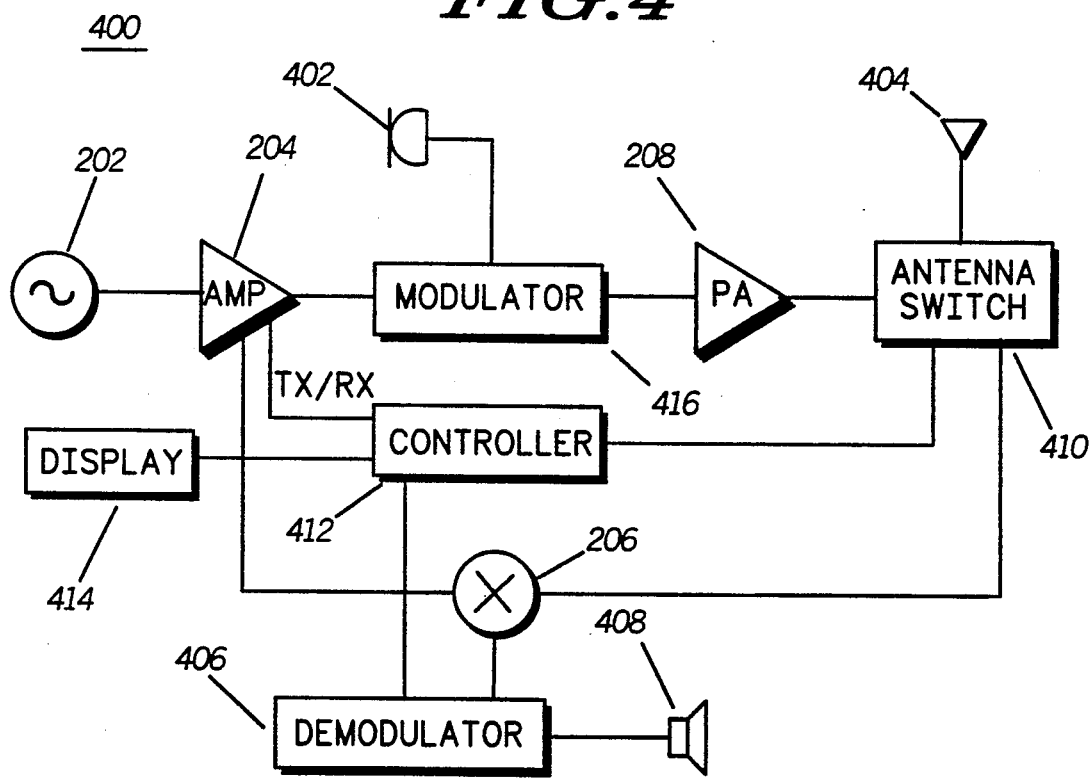
FIG. 4 shows a communication device in accordance with the present invention.

Referring now to FIG. 4, a block diagram of a communication device 400 in a accordance with the present invention is shown. The device 400 includes an antenna 404 which is used to receive and transmit radio frequency signals. In the receive mode, a received signal is coupled from the antenna 404 to a mixer 206 via an antenna switch 410; The mixer 206 receives a local oscillator from the oscillator 202 via the amplifier 204. The difference signal of the mixer 206 is coupled to a demodulator circuit 406 where the received signal is demodulated. The audio components of the demodulated signal are then coupled to a speaker 408. Data components of the received signal are coupled from the demodulator 406 to the controller 412 where they are decoded and presented to the user on a display 414.

In the transmit mode, the signal from the oscillator 202 is coupled to a modulator via the amplifier 204. Audio signals transduced by a microphone 402 are coupled to the modulator 416 where they are used to modulate the oscillator signals. The modulated signal is then coupled to the power amplifier 208 where they are amplified. The amplified signals are coupled to the antenna 404 via the antenna switch 410. A control signal from the controller 412 controls the operation of the antenna switch 410. The controller 412 provides the appropriate switching signals to Rx and Tx lines of the amplifier 204 in order to provide the appropriate signal to the mixer 206 or the modulator 416, respectively.

In summary, a port switchable variable gain amplifier is provided having a biasing circuit comprising switches that switch the gain of the amplifier from one level to another. The use of the switches 310 and 320 in the biasing network eliminates the need for exclusive switches, hence curtailing current consumption and parts count. Indeed, since switches 310 and 320 are in series with the bias current of the transistor 330, they draw no additional current. By varying the bias current, as well as load resistances, the gain of the amplifier 330 is varied so as to provide different levels of signals to different segments of a circuit. As each port is switched, a corresponding bias condition is also switched giving the amplifier 330 a different gain. This results in significant current savings, especially when the receive port is selected. This is true since the receive mode is the predominant operating mode of a communication device and hence current savings are highly desirable in this mode. Under standby conditions, the input match on the receive side can be optimized to allow a small current drain. In transmit mode, the base current can be increased dramatically to provide higher output signal levels. A benefit of the present invention is that the objectives of providing a switchable amplifier are met with significantly fewer components as would otherwise be feasible with presently available schemes. In the preferred embodiment, the switch adaptable buffer 204 greatly reduces the current drain. Indeed the buffer 204 saves 6 milliamps in the receive and about 20 milliamps in the transmit mode. This current savings is significant in portable communication devices where power source is a battery that must survive a required operating time.

What is claimed is:

1. A radio frequency amplifier, comprising: amplifier means having a gain for amplifying an input signal to selectively
    produce at least a first signal at a first output and at least a second signal
    at a second output; biasing means for biasing the amplifier means, the biasing means having at
    least a first and a second state for setting the gain of the amplifier means
    in producing the 1st and 2nd signals, respectively; and switching means for switching the states of the biasing means.

2. The radio frequency variable gain amplifier of claim 1, further including a plurality of matching networks for coupling the plurality of outputs to a plurality of loads.

3. The radio frequency amplifier of claim 1, wherein the amplifier means includes a transistor amplifier.

4. The radio frequency variable gain amplifier of claim 1, wherein the biasing means includes the switching means.

5. The radio frequency variable gain amplifier of claim 1, wherein the switching means includes a PIN diode.

6. A radio communication device, comprising:
    a transmitter having a power amplifier;
    a receiver having a mixer;
    an oscillator for providing a radio frequency frequency signal; and
    an amplifier means coupled to the oscillator and having a first gain state for amplifying and coupling the radio frequency signal to the transmitter and a second gain state for amplifying and coupling the radio frequency signal to the receiver.

7. The radio communication device of claim 6, wherein the amplifier means includes biasing means for selectively biasing the amplifier means to produce the plurality of switchable fixed gains states.

8. The radio communication device of claim 7, wherein the biasing means includes switching means for selectively switching between the plurality of switchable fixed gain states.

* * * * *